INVENTOR.
HEIN KOELMANS
BY
AGENT

INVENTOR.
HEIN KOELMANS
BY
Frank R. Trifari
AGENT

INVENTOR.
HEIN KOELMANS
BY
Frank R. Trifari
AGENT

INVENTOR.
HEIN KOELMANS
BY
Frank R. Jifoni
AGENT

INVENTOR.
HEIN KOELMANS
BY
Frank R. Trifari
AGENT

INVENTOR.
HEIN KOELMANS
BY
Frank R. Jeifari
AGENT

United States Patent Office 3,518,511

Patented June 30, 1970

3,518,511

SEMICONDUCTOR DEVICE HAVING AT LEAST ONE CONTACT APPLIED TO A SEMICONDUCTOR MATERIAL OF THE TYPE II-B—VI-A AND METHOD OF MANUFACTURING SUCH DEVICE

Hein Koelmans, Emmasingel, Eindhoven, Netherlands, assignor, by mesne assignments, to U.S. Philips Corporation, New York, N.Y., a corporation of Delaware Filed Aug. 14, 1967, Ser. No. 660,332

Claims priority, application Netherlands, Aug. 17, 1966, 6611537

Int. Cl. H01l 3/20

U.S. Cl. 317—237 7 Claims

ABSTRACT OF THE DISCLOSURE

A semiconductor device, for example, a thin-film field-effect transistor, using a chalcogenide semiconductor with a low resistance ohmic contact thereto of an alloy of (a) gold, (b) indium or gallium, and (c) zinc or cadmium.

The invention relates to a semiconductor device in which a semiconductor material of the type II–B—VI–A is used to which at least one contact on the base of gold is applied, and to a method of manufacturing such a semiconductor device. A semiconductor material of the type II–B—VI–A is understood herein to mean a semiconductor material from a chalcogenide, that is to say sulphide, selenide or telluride, or a mixture or a mixed crystal of calcogenides of one or more of the elements from the group II–B of the periodic system of the elements, that is to say zinc, cadmium and/or mercury. Known semiconductor devices using a semiconductor material of the type II–B—VI–A are photocells, more particularly photoconductive cells, in which especially cadmium sulphide, cadmium selenide or mixtures or mixed crystals of these two cadmium salts are used as semiconductor material. Other known semiconductor devices using a semiconductor material of the type II–B—VI–A are field effect transistors, more particularly field effect transistors having one or more gate electrodes which are separated from the semiconductor material by an insulating layer or a layer of a different material exhibiting a large energy gap. Cadmium sulphide and cadmium selenide are particularly suitable for use as semiconductor material in such a field effect transistor. However, the invention is not limited to semiconductor devices of the last-mentioned types or to the use of cadmium sulphide or cadmium selenide as semiconductor material. Other semiconductor materials consisting of compounds from the above group are, for example, cadmium telluride, zinc selenide and zinc telluride, mixed crystals or mixtures of II–B—VI–A compounds being also suitable for this purpose.

The present invention has inter alia for an object to provide a suitable contact material for semiconductor materials of the type stated in the preamble. It is already known to use pure gold for contacts on cadmium sulphite or cadmium selenide. Such gold contacts have been used, for example, as source- and drain electrodes of photoconducting cells and as source- and drain electrodes of field effect transistors. It has been found, however, that such gold electrodes can form comparatively high contact resistances with said semiconductor materials so that, for example in photocells, these contacts provide an additional series resistance. More particularly in field effect transistors these contact resistances at the source- and drain electrodes produce undesirable variations of the characteristic of said field effect transistors. The invention has further for an object to provide for semiconductor devices of the kind stated in the preamble a contact material which does not exhibit the above disadvantages. According to the invention, the contact consists of an alloy of gold, at least one of the elements indium and gallium and at least one of the elements zinc and cadmium. Indium and gallium belong to the third group of the periodic system of the elements and act as donors in semiconductor materials of the said kind by substitution of the II–B elements of the semiconductor compounds. Excess quantities of zinc and cadmium, incorporated in the said semi-conductor materials, likewise act as donors. As is known, the said gold-alloyed contacts may form a solid solution with gold up to comparatively high concentrations, i.e. of the order of 10 at. percent for gallium and indium and of the order of 20 at. percent for cadmium and zinc.

It should be noted that it is known to form a contact on cadmium chalcogenide semiconductors by first applying a layer of indium and then a layer of gold to the surface of the semiconductor. When a contact of indium is used, the low melting point of indium is disadvantageous if it is desirable to carry out a stabilizing thermal aftertreatment. In this respect, gallium only is more unfavourable than indium, since the melting point of gallium is even lower than that of indium. Zinc and cadmium are comparatively volatile and for this reason not particularly suitable for use as contact material, especially if a thermal aftertreatment should be carried out. It has now been found that at temperatures which are not excessively high, zinc or cadmium hardly or only very slowly evaporates from solid solutions of zinc or cadmium in gold provided that the content of zinc or cadmium is not raised excessively. It is known that gold contacts on cadmium chalcogenide semiconductors extract a small quantity of cadmium from the seimconductor material. The concentration of the cadmium absorbed by the gold is, however, low in said case.

It should be noted that alloys of gold with gallium are known as contact material on silicon. Additions of gallium or indium to gold materially reduce the melting point, i.e. to a greater extent than cadmium or zinc. Alloys of gold comprising cadmium and/or zinc as well as indium and/or gallium when used as contact material for semiconductors of the type II–B—VI–A are found to form with these semiconductors a low contact resistance for negative charge carriers, as a result of which this contact resistance is a negligible factor for many applications. The ohmic character of such a contact, for example, on cadmium sulphide or cadmium selenide is apparent from the fact that the exposure of the junction between contact material and semiconductor does not produce a perceptible photovoltage. It has further been found that contacts of the said alloy have properties which are more satisfactorily reproducible than those of contacts of gold with cadmium and/or zinc without the addition of indium and/or gallium. The quantity of indium or gallium may be kept low, for example, below 5 at. percent whilst retaining the favourable effect, and the content of zinc or cadmium may be kept below a value at which a disturbing evaporation may occur during a thermal treatment. This content need not be previously determined. It is sufficient to previously subject the gold alloy to a thermal treatment. In the case of an excessively high content of volatile metal, this metal is evaporated until a sufficiently low content has been attained to permit only a very slight evaporation. In the case of an originally lower content of cadmium or zinc, evaporation will hardly occur so that this content remains substantially unchanged. The starting material may also consist of an alloy of gold with indium which is exposed during a thermal treatment to vapour of cadmium or zinc. The maximum solubility is then determined by vapour pressure and temperature and the content is reduced by shortening the treatment.

In order to avoid that the application of the contact unnecessarily increases the factors determining the properties of the semiconductor material by factors that can be controlled only with difficulty, preferably the same II–B-element is used in the contact material as well as in the semiconductor material. Especially when the contact is used in semiconductors belonging to the important group of the cadmium chalcogenides, the said contact material preferably contains cadmium. Nevertheless, in certain cases, for example, in which the energy gap should be varied, the use of zinc in the said gold alloy could be preferred.

A few of the semiconductor compounds of the type II–B—VI–A, such as cadmium telluride, may be both of the n- and of the p-conductivity type, whilst others are solely electron-conducting, since any holes in these compounds are not or hardly mobile. The latter group more particularly comprises cadmium sulphide and cadmium selenide. The contact resistances for n-type charge carriers toward and away from the semiconductor material between the contact of the gold alloy according to the invention and semiconductor materials from compounds of the type II–B—VI–A are only very low. This property is particularly important for contacts on cadmium selenide or cadmium sulphide where the mobile charge carriers solely consists of electrons.

Owing to the said low contact resistances of contacts of the gold alloy according to the invention, this alloy is particularly suitable for use in field effect transistors as source- and/or drain electrode. It should be noted that the presence of such contact resistances in source- and drain electrodes gives rise to irregularities in the characteristics of the field effect transistors. Such a field effect transistor preferably includes a gate electrode which is separated from the semiconductor material by an insulating layer.

In the latter field effect transistor, preferably at least one gate electrode is applied to the same surface of the semiconductor material as the source- and drain electrodes. For it has been found that in this case a $V_{g0}$ of comparatively low value can be obtained, $V_{g0}$ representing, as is usual, the threshold gate voltage at the gate electrode. The threshold gate voltage of a field effect transistor is to be understood to mean herein the gate voltage at which—apart from a small leakage current—just no conduction occurs between the source electrode and the drain electrode. The threshold gate voltage is defined by plotting $\sqrt{i_D}$ on $V_g$ (at a constant $V_D$) and by lengthening the straight ascending part of the curve until it arrives at the $V_g$-axis.

The low threshold gate voltage could be due to cadmium or zinc being diffused from the source- and/or drain electrode through the semiconductor surface into the part of the semiconductor device located between said electrodes and compensating for electron-trapping centres at the semiconductor surface. The field effect transistor may be composed in known manner of thin layers of materials operative for this electrode system, which layers are applied to a substrate. If the gate electrode as well as the source- and drain electrodes are applied to the semiconductor material, such a field effect transistor may be constructed so that the semiconductor material is applied to the substrate and the electrodes are applied to the semiconductor material. Very favourable results are obtained with field effect transistors in which the electrodes are disposed between the substrate and the semiconductor. The insulating layer between the gate electrode(s) and the semiconductor is preferably made of alumina. The gate electrode and the insulating layer are both preferably made of anodically oxidized aluminum.

The invention further relates to a method of manufacturing a semiconductor device, more particularly a field effect transistor, which uses a semiconductor material of the type II–B—VI–A and at least one contact on the base of gold, such a contact of a gold alloy containing in this case at least one of the elements indium and gallium and at least one of the elements zinc or cadmium, whilst the relevant part of the semiconductor device is made of the semiconductor material of the type II–B—VI–A and the relevant contact or contacts is or are made of the gold alloy. According to the invention, this method is characterized in that the semiconductor device after its manufacture is subjected to an annealing treatment. It should be noted that annealing treatments of semiconductor devices using semiconductor material of cadmium sulphide, cadmium selenide or cadmium telluride are known for obtaining a greater stabiity of the characteristics of the semiconductor device. In the present case in which gold alloys containing indium and/or gallium and zinc and/or cadmium are used, the annealing treatment results not only in an increased stability, but in many cases also in a substantial improvement of the properties. This improvement becomes manifest especially in the manufacture of field effect transistors. The improvement may be due to gallium or indium or more probably zinc or cadmium creeping from the source- and/or drain electrodes along the semiconductor surface, which elements have a compensting effect on acceptors or other electron-trapping centres or impurities producing such centres, for example, oxygen, in that they chemically bind said impurities. Especially for field effect transistors, such a compensation would result in a small $V_{g0}$, i.e. a low threshold gate voltage. The said diffusion from the electrode over the semiconductor surface would not only occur over a free surface, but also along an interface between the semiconductor and another material, for example, of the substrate surface or of an insulating layer which separates the semiconductor from a gate electrode in field effect transistors.

The annealing treatment is preferably carried out in two steps, the temperature during the first step exceeding that during the second step. The temperature in the first step preferably lies between 400° C. and 600° C., whilst the temperature in the second step preferably lies between 100° C. and 500° C., with the condition that the temperature in the second step must be lower than that in the first step. The duration of each step of the annealing treatment preferably lies between 1 minute and 1 hour. When cadmium selenide is used as semiconductor material, an annealing treatment is carried out in which the temperature in the second step preferably lies between 150° C. and 350° C.

The annealing treatment is preferably carried out in an oxygen atmosphere, for example, air. In the case of an annealing treatment comprising two steps, the first step is preferably carried out in an oxygen atmosphere, whereas also in the second step the use of an oxygen atmosphere is preferred.

The invention will now be described more fully with reference to the accompanying drawings, in which:

FIGS. 1 to 11 show diagrammatically stages in the manufacture of field effect transistors.

FIGS. 1, 2, 3, 5, 6, 7, 9, and 10 are cross-sectional views of successive stages.

FIGS. 4, 8 and 11 are plan views of manufacturing stages of six field effect transistors corresponding to the cross-sectional views of the stages shown in FIGS. 3, 7 and 10, respectively.

FIGS. 10 and 11 relate to the finished effect transistors.

Figure 10:
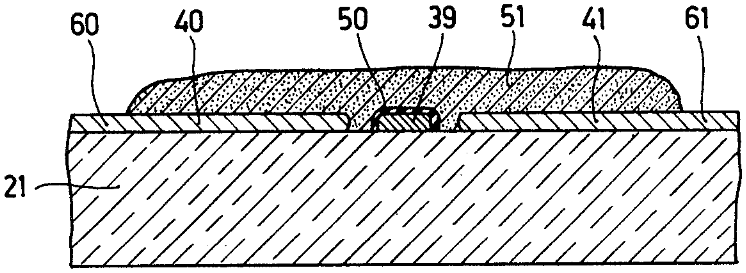
Figure 11:
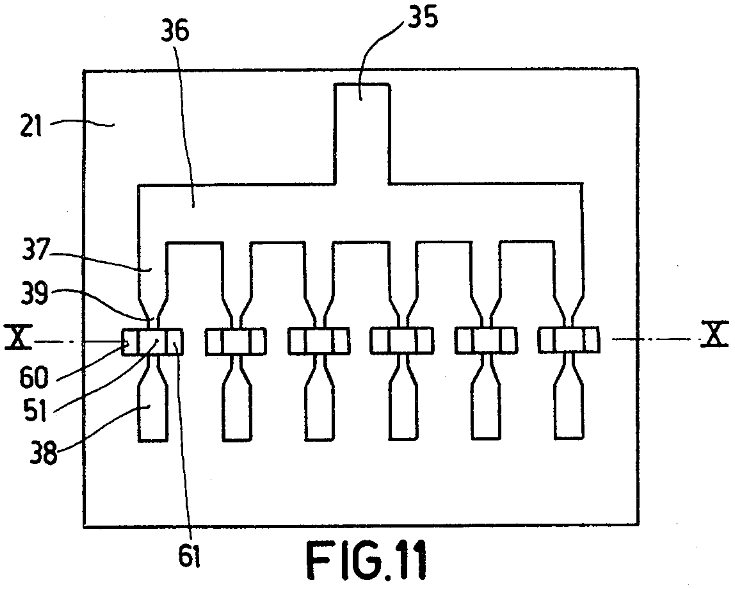

FIGS. 10 and 11 show a field effect transistor of a type which is composed of thin layers on a substrate, a so-called thin-film-transistor, the source- and drain electrodes as well as the—in this case single—gate electrode being disposed between the substrate and the cadmium selenide semiconductor material. The substrate consists of a glass plate 21 to which is applied a set of gate electrodes 39 each having a "length" of 9$\mu$, a "width" of 2.5 mm. and a thickness of 0.1$\mu$ and which is coated with a layer of alumina 50 which acts as a dielectric between the gate electrode and the semiconductor surface. Both ends of the gate electrodes are connected to wide connecting strips 37 and 38. As shown in FIG. 11, the connecting strips 37 are relatively shortcircuited by a wide connecting strip 36, but this connecting strip 36 and the connecting strip 35 which, as will be described below, has been used for the electrolytic formation of the oxide film, may be removed, if desired.

The source- and drain electrodes 40 and 41 are located on either side of the gate electrode 39 and are separated from this electrode by a small gap of 0.5$\mu$, whilst a layer 51 of cadmium selenide semiconductor material is applied to part of these electrodes and the gate electrode 39. It should be noted that only the polarity of the voltage applied between the two electrodes 40 and 41 determines which electrode acts as the source electrode and which acts as the drain electrode. In the present case, in which a semiconductor material is used which cannot have any substantial hole conduction but can solely have electron conduction, the electrode which is positively biassed with respect to the other electrode acts as the drain electrode, since in this manner the source electrode injects the charge carriers (electrons) and the drain electrode collects the charge carriers.

The electrodes 40 and 41 and the layer 51 of semiconductor material have a substantially square shape and dimensions of about 2 x 2 mm. The layer 51 of high-ohmic cadmium selenide has a thickness of about 0.2$\mu$ and the electrodes 40 and 41 have a layer thickness of about 0.1$\mu$.

The layer 51 of semiconductive cadmium selenide covers approximately half of each of the two electrodes 40 and 41, parts 60 and 61, respectively, of each of these electrodes being left free for the provision of connections to source- and drain electrodes.

Figure 14:
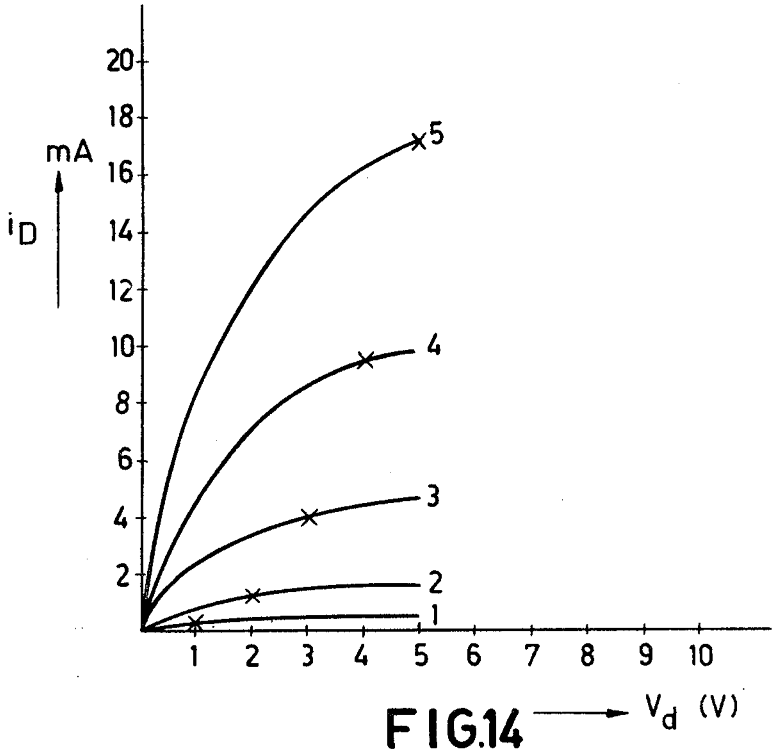
FIGS. 14 to 16 show graphs which diagrammatically represent current-drain voltage characteristics of field effect transistors.
Figure 15:
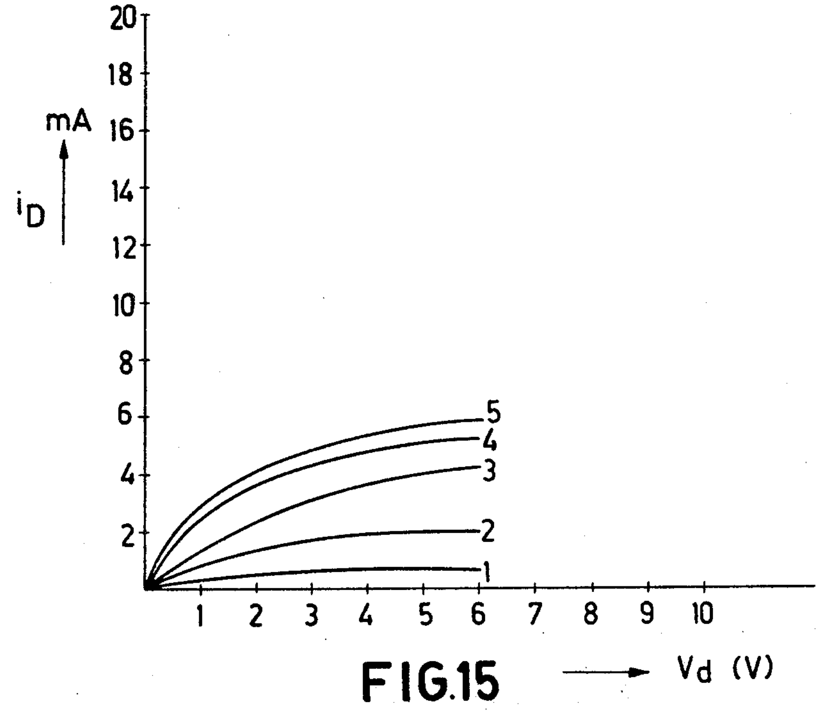
Figure 16:
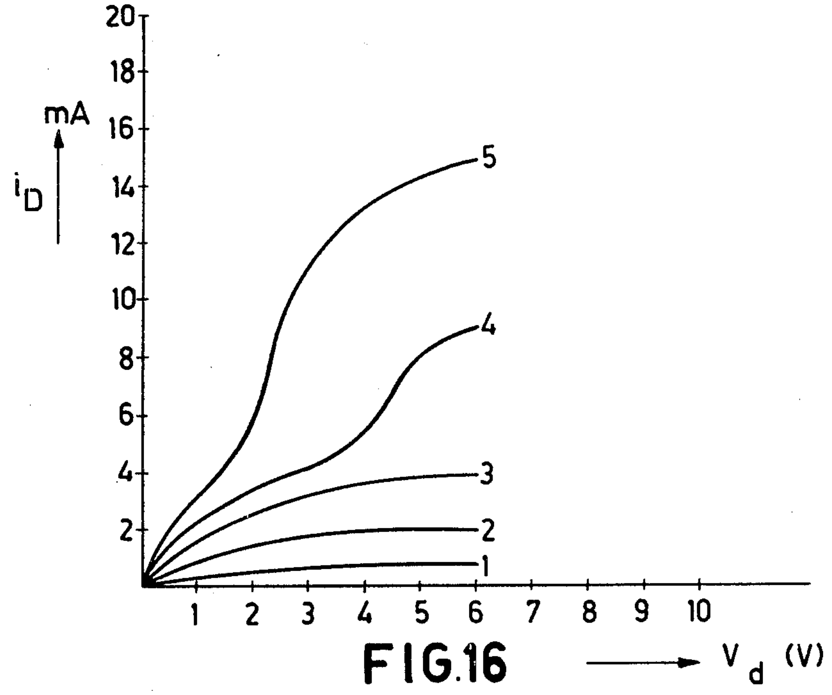

The source- and drain electrodes 40 and 41 consist of an alloy of gold, indium and cadmium, gold being the main constituent, the content of indium being about 1.7 at. percent and cadmium being absorbed by diffusion in such a high concentration that the alloy has assumed a grey colour. These electrodes form an excellent ohmic contact with the semiconductor with such a low contact resistance for electrons travelling away from or towards the semiconductor that the properties of this field effect transistor are hardly influenced by this resistance, as will be further discussed below. The influence of the quality of the contacts of source- and drain electrodes on the properties of field effect transistors will be illustrated with reference to FIGS. 14 to 16 which represent current-voltage characteristics between source- and drain electrodes at different gate voltages, the current between the source- and drain electrodes being determined by conduction of electrons in the semiconductor. FIG. 14 relates to a field effect transistor having source- and drain electrodes which form such low contact resistances with the semiconductor that these resistances do not influence the properties of the field effect transistor. In the field effect transistor concerned, the current $i_D$ between source electrode and drain electrode is determined by the transport of negative charge carriers (electrons). The drain electrode in this case must be positively biassed with respect to the source electrode. At a given gate voltage, $V_{go}$, a state is obtained in the semiconductor material in which just no conducting channel is formed between the source electrode and the drain electrode. This gate voltage, $V_{go}$, is often referred to as threshold gate voltage. Depending upon the nature of the semiconductor surface between the source electrode and the drain electrode on the side to which the gate electrode is applied, this threshold gate voltage, measured with respect to the source electrode, may be zero, but it will generally deviate more or less strongly from the zero value, and in principle the threshold gate voltage may have a negative or a positive value. If $V_{go}$ is negative, a conducting channel is formed when the gate electrode is not biassed, which channel disappears in the case of a negative gate voltage $V_{go}$, whilst no conducting channel is formed if $V_{go}$ is positive and the gate electrode is not biassed, such channel being formed only from said $V_{go}$-value upwards. At gate voltages which are less than $V_{go}$, apart from a small leakage current, no current can flow between the source electrode and the drain electrode. At gate voltages which exceed $V_{go}$, a conducting channel is formed between source electrode and drain electrode. In FIGS. 14 to 16, the current-voltage characteristics between the source and drain electrodes are plotted for various values of $V_g-V_{go}$, $V_g$ representing the gate voltage applied. The voltage between the source electrode and the drain electrode, referred to hereinafter as drain voltage, is denoted by $V_D$ and is plotted on the abscissa, the current strength, $i_D$, being plotted on the ordinate.

It is apparent from FIG. 14 that when $V_g-V_{go}$ is constant and $V_D$ increases, the current strength first increases substantially linearly from zero, whereupon this increase of the current strength diminishes so that the curve bends over to the right. At a higher $V_D$, in general from a $V_D$-value equal to $V_g-V_{go}$, the curve resumes its substantially straight course and extends substantially horizontally or slightly obliquely in upward direction. The drain voltage at which the curve reassumes its substantially horizontal course (in general approximately equal to $V_g-V_{go}$) and the associated current strength are referred to as "pinch-off voltage" and "saturation current," respectively, as the current strength hardly or only very gradually increases with a further increase of the drain voltage. In an efficient field effect transistor, this saturation current increases quadratically with the reduced gate voltage $V_g-V_{go}$.

at. percent and cadmium being absorbed by diffusion in 14 relate to gate voltages increasing by 1 V, $V_g-V_{go}$ having increased from 1 v. to 5 v. If the source- and drain electrodes are of poor quality, it has been found that two cases of influencing the properties of a field effect transistor may occur, which will be described with reference to FIGS. 15 and 16. FIG. 15 illustrates that with an unsatisfactory contact for the source- and/or drain electrode, an increasing gate voltage may initially give rise to a superlinear increase of the saturation current, but that at the higher gate voltage, the saturation current only slightly increases with an increase of said gate voltage and approaches an asymptotic value. This asymptotic value may be strongly different for each of a number of field effect transistors manufactured in the same series. The characteristics shown in FIG. 15 are found to correspond approximately to those of an efficient field effect transistor and a resistor connected in series therewith.

In other field effect transistors having poor contacts, characteristics were obtained of the kind shown in FIG. 16. At higher gate voltages, the curves more strongly bend over to the right than in the case of satisfactory contacts, but the current strength is found to increase strongly with increasing drain voltage, whereupon the curve again bends over to the right and then seems to have the same course as in the case of contacts of good quality. The more or less S-shaped course of the curves could be accounted for by a certain rectifying effect of one of the contacts, breakdown occurring when a given contact voltage is exceeded.

A comparison of field effect transistors as shown in

FIGS. 10 and 11 using as semiconductor material a high-ohmic cadmium selenide and having source and drain electrodes of pure gold, of gold and cadmium, or of gold, indium and cadmium was made. When pure gold is used, less than 10% of the field effect transistors have characteristics which are analogous to those of FIG. 14, whilst the remaining transistors have characteristics of the kind shown in FIG. 15 or FIG. 16, and in certain cases the saturation current may even reach a maximum of only ½ ma. Field effect transistors having electrodes of a gold-cadmium alloy are found to have only for a third part favourable characteristics in accordance with FIG. 14, whilst the remaining transistors have characteristics of the kind shown in FIG. 15 or FIG. 16. Field effect transistors having source and drain electrodes of gold-indium-cadmium alloys, which have been manufactured by the method described above, are found to have for well over 90% favourable characteristics of the kind shown in FIG. 14, whilst with a constant drain voltage of 6 v. and a reduced gate voltage ($V_g-V_{go}$) varying from 0 to 6 v., the steepness of the current-voltage characteristic is on the average some milliamps per volt.

The field effect transistors as shown in FIGS. 10 and 11 and as described above may be manufactured as follows.

Figures 1, 2:
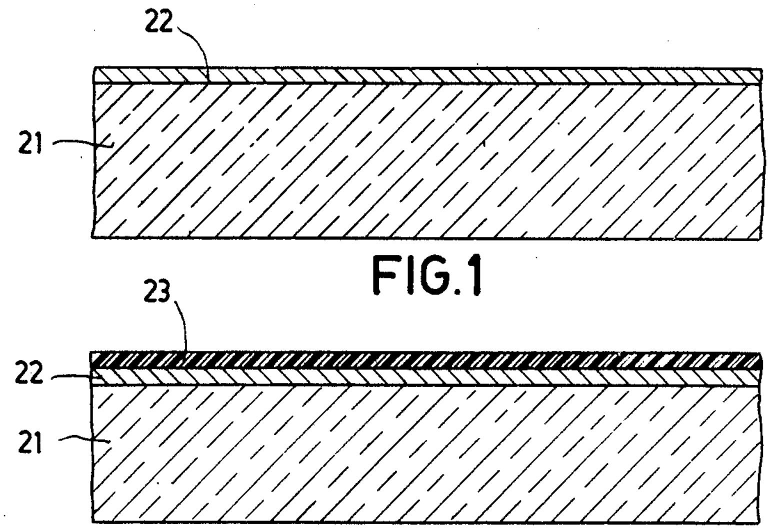
Figure 3:
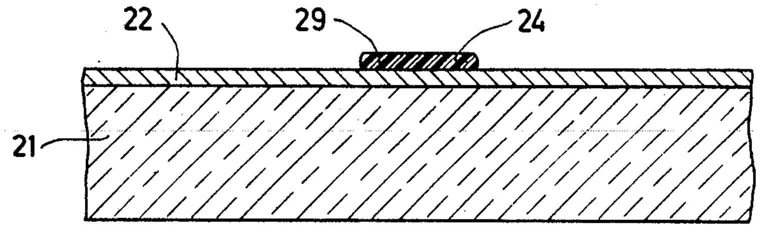
Figure 4:
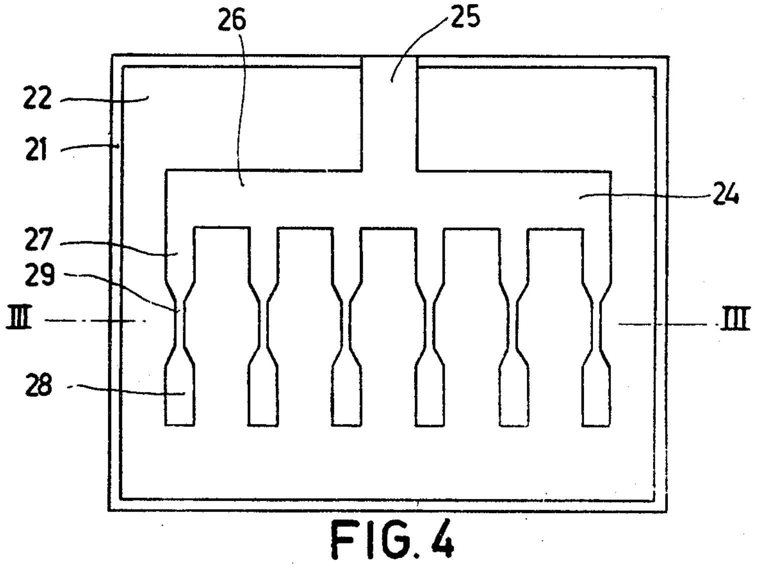
Figure 5:
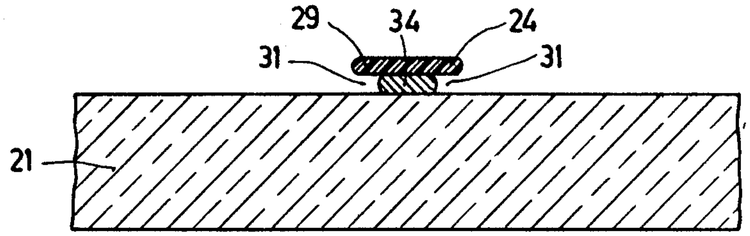

To one surface of a glass plate 21 is applied by vapour deposition an aluminium layer 22 having a thickness of about 0.1$\mu$ (cf. FIG. 1), to which layer 22 is then applied a layer 23 of a photoresist having a thickness of about 1$\mu$; for this purpose, use is made in this case of a photoresist commercially available under the name of "Kalle Kopierlack" (cf. FIG. 2). When the photoresist layer is exposed to ultraviolet radiation with the use of a suitable optical mask and is treated with a solution of 2% by weight of KOH in water, during which treatment the exposed parts of the layer 23 are dissolved, a non-exposed part 24 (cf. FIG. 3) of the lacquer layer is left in accordance with the pattern shown in FIG. 4, which consists of a wide strip 25 at the periphery of the glass plate 21 and of a comb-shaped part 26 of which each tooth comprises two wider parts 27 and 28 and an interposed narrow strip 29. The narrow strips 29 have a length of 2.5 mm. and a width of 10$\mu$. After being washed with de-ionized water, the assembly is subjected to an etching treatment for aluminium. For this purpose, the plate is immersed in an aqueous solution of orthophosphoric acid obtained by mixing equal volumes of water and concentrated phosphoric acid (85% by weight of $H_3PO_4$. The etching treatment is carried out for 60 minutes at room temperature (20° C.) and the glass plate 21 is then removed from the etching liquid and is immediately rinsed with de-ionized water. Not only has the exposed aluminium which is not coated with the masking lacquer layer 24, disappeared owing to the etching treatment, but also an edge portion 31 located under the mask 24 and having a width of 0.5$\mu$ has been etched away so that the resulting pattern 34 of the aluminium layer is slightly narrower than the pattern 24 of the layer of photosensitive lacquer (cf. FIG. 5). The assembly is then dried at 50° C.

Figure 6:
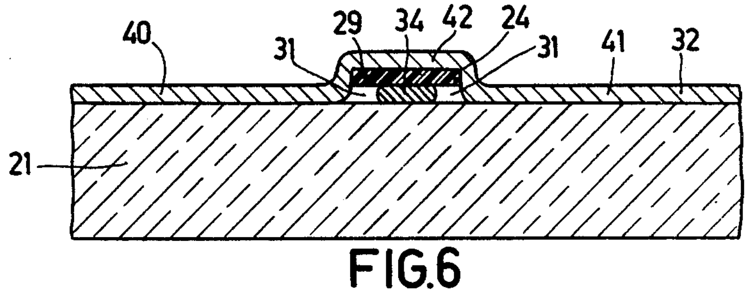

In order to obtain contact layers of gold alloyed with indium and cadmium, an alloy of gold and indium is now applied by vapour deposition, the starting substance consisting of a charge of a premanufactured alloy of 1% by weight (about 1.7 at. percent) of indium and for the remaining part of gold, which charge is substantially completely evaporated. First a small quantity of chromium and then the gold-indium alloy is vapour-deposited up to a layer thickness of about 0.1$\mu$. The chromium provides a better adhesion of the gold-indium alloy to the glass surface. With the use of a suitable vapour-deposition mask, a few relatively separated metal layers 32 are obtained which have a rectangular shape (4 mm. x 2 mm.) and which extend throughout the narrow lacquer strip 29 (cf. FIG. 6). Each layers 32 of the gold-indium alloy consists of two parts 40 and 41 of substantially square shape which are adhered to the glass substrate 21, whilst an interposed part 42 is applied to the lacquer strip 29. The parts 40 and 41 are separated from the aluminium 34 by the narrow gap 31, obtained by underetching.

Figure 7:
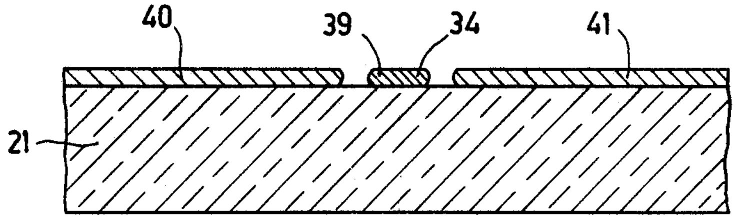
Figure 8:
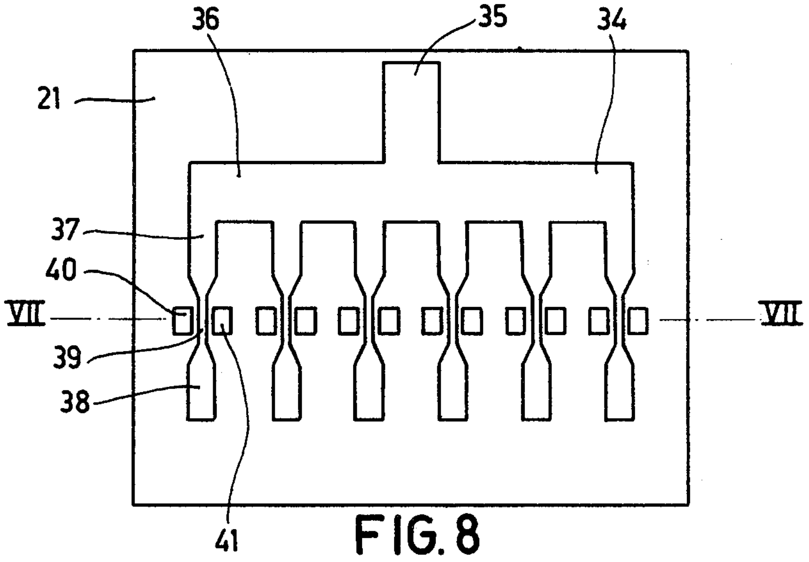

The glass plate 21 is immersed in an acetone bath and use is made of ultrasonic vibration. The residual lacquer layer 24 is dissolved and the gold-indium alloy applied thereto then disengages so that only the metal applied to the glass is left (cf. FIGS. 7 and 8). The pattern of the remaining aluminium layer 34 consists of a strip 35 and a comb-shaped part 36 the teeth of which are formed by two wide parts 37 and 38 which are interconnected by means of a narrow strip 39 having a length of 2.5 mm. and a width of 9$\mu$. The layer parts 40 and 41 consisting of the gold-indium alloy are located on either side of the narrow strips 39 and are each separated from the interposed strip 39 by a narrow gap obtained by underetching and having a width of 0.5$\mu$.

Figure 9:
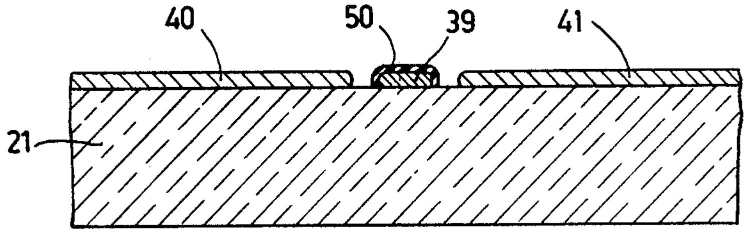

The aluminium is now subjected to an anodically oxidizing treatment for which an electrolyte bath is used which consists of a solution containing per litre of water 7.5 gms. of borax and 30 gms. of boric acid. A clamp contact is secured to the strip 35 and a platinum electrode, in which, like the glass plate, is immersed in the electrolyte, is arranged opposite that surface of the glass plate to which the metal layers are applied. This electrode is connected as the cathode and the aluminium layer 34 is connected as the anode, an anode voltage of 30 v. being applied with respect to the cathode. After approximately half an hour, the current strength has decreased to 1$\mu$a. The electrolytic treatment is now stopped. The glass plate is removed, rinsed with de-ionized water, dried, rinsed with isopropyl alcohol and dried again. Owing to the anodic treatment of the surface parts of the aluminium layer exposed to the electrolyte, an aluminium oxide layer 50 has formed on these parts (cf. FIG. 9).

Figure 12:
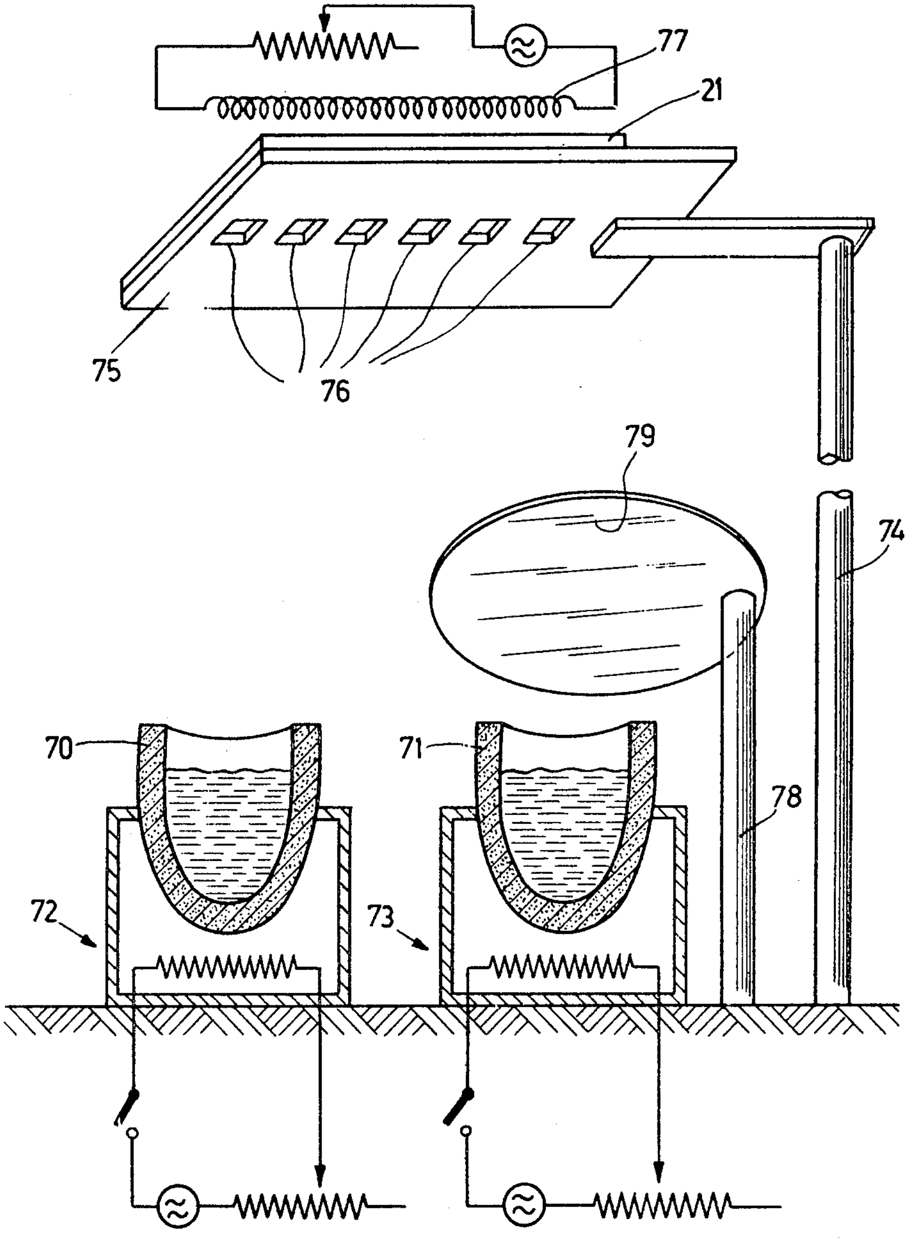
FIG. 12 is a diagrammatic front elevation of a vapour-deposition arrangement, shown partly in longitudinal sectional view and partly in perspective view.

Subsequently, the assembly is subjected to a vapour-deposition treatment in vacuum in order to form the semiconductor layer. FIG. 12 shows diagrammatically the employed arrangement inside a vacuum-bell jar (not shown). In this vacuum bell jar are arranged two crucibles 70 and 71 for material to be evaporated which can be heated by electric resistance furnaces 72 and 73, respectively. To a support 74 is secured a vapour-deposition mask 75 upon which the glass plate 21 is arranged so that its surface provided with the electrodes is directed downwards. The vapour-deposition mask is provided with rectangular apertures 76 and the plate 21 is placed on the mask so that the layer parts 40 and 41 consisting of th gold-indium alloy and the interposed narrow strips of anodically oxidized aluminium 39 (cf. FIG. 8) are in part located above the apertures 76. Above the mask 75 and the plate 21 is arranged a heater element 77 so that the vapour-deposition surface can be heated at the desired temperature during the vapour-deposition treatment.

A vertically arranged shaft 78 has secured to it a horizontally arranged screen 79 which is located above the crucible 71 but can be removed from this position by a horizontal pivotal movement.

The crucible 70 is filled with cadmium and the crucible 71 with cadmium selenide. The vacuum-bell jar (now shown) is no placed over the crucibles containing the material to be vapour-deposited and over the substrate to be plated, whereupon it is evacuated. By means of the heater element 77, the glass plate 21 is heated at 170° C. to 180° C. The crucible 70 is then heated by means of the furnace 72 at 300° C. so that cadmium evaporates from the crucible and the cadmium vapour acts through the aperture 76 upon the surface of the glass plate 21 to which the electrodes are applied. Heating of the glass plate results in that the cadmium, due to its high volatility, cannot form a cadmium layer on the surface of the vapour-deposition substrate. It is absorbed, however, by the gold-indium alloy into which it rapidly diffused throughout the gold-indium layer, which becomes manifest in the grey discolouring of the layer on the side facing the glass substrate. Thus, the source and drain electrode consisting of an alloy of gold, indium and cadmium for use in the field effect transistors to be manufactured are obtained.

Meanwhile, the crucible 71 containing the cadmium selenide is also heated by means of the furnace 73. After the crucible 70 containing the cadmium has been heated for 2 minutes at 300° C. and the cadmium vapour has been applied, the screen 79 is turned away. The crucible 71 has in the meantime been heated up to 900° C., at which temperature cadmium selenide evaporates. When the screen 79 is turned away, the evaporated cadmium selenide has free access through the apertures 76 in the mask 75 to the surface parts of the glass plate 21 to which electrodes are applied. The vapour deposition of cadmium selenide and the vapour deposition of cadmium are continued for 1 minute and the temperature of the crucible 71 is raised to 1200° C., whereupon the furnaces 72 and 73 are switched off and the crucibles 70 and 71 are cooled down. Furthermore, the heating of plate 21 is also stopped and the vacuum is eliminated.

Layer portions 51 of cadmium selenide of square shape (dimensions 2 x 2 mm.) and 0.2$\mu$ thickness have formed which each cover part of the layers 40 and 41 of the gold-indium-cadmium alloy and the part of the narrow strip 39 located between these layers (cf. FIGS. 10 and 11). Subsequently, an annealing treatment is carried out. The glass plate 21 with the field effect transistors is first heated in air for approximately 3 minutes at 500° C.

The said treatment at 500° C. increases the resistance of the semiconductor, especially if the treatment is carried out in an oxygen-containing atmosphere, such as air.

It has been found that after this treatment, the threshold gate voltage $V_{go}$ for field effect transistors manufactured and treated in the manner described lies between approximately 1 v. and 1.5 v.

Figure 13:
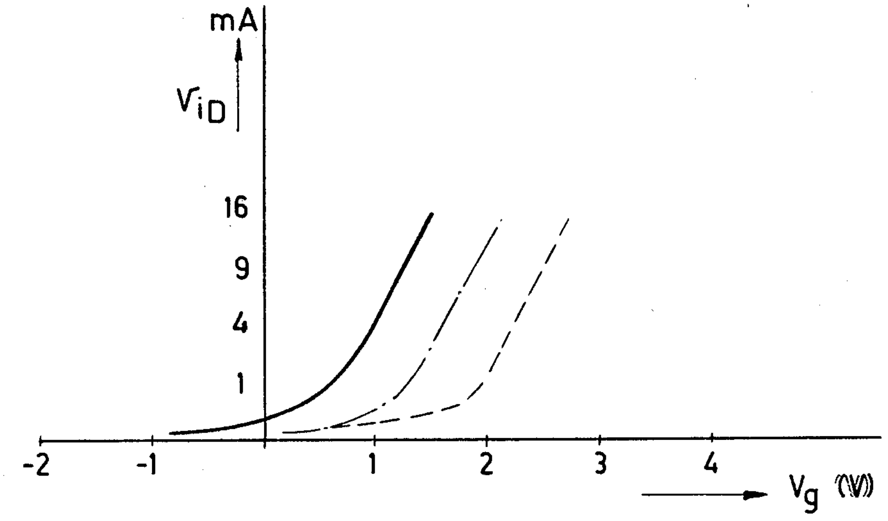
FIG. 13 shows a graph which diagrammatically represents current-gate voltage characteristics of field effect transistors.

In FIG. 13, at a constant drain voltage, the root of the current strength, $i_D$, is plotted as a function of the gate voltage $V_g$. The dot-and-dash curve relates to a field effect transistor immediately after the thermal treatment at 500° C. When the linear part of the curve is lengthened until it arrives at the abscissa, a threshold gate voltage $V_{go}$ is found. The relevant dot-and-dash curve relates to a field effect transistor across which the $V_{go}$ is approximately 1 v. after the thermal treatment. Such a threshold gate voltage is sufficiently low for practical uses.

Experiments have shown that in the long run the threshold gate voltage may slightly change, that is to say that it may still increase, though this increase remains below 1 v. In general, this increase is approximately ½ to ¾ v. The broken curve in FIG. 13 relates to such an aged field effect transistor which originally had an $i_D$–$V_g$-characteristic according to the dot-and-dash curve. The curves all relate to the same constant drain voltage. After ageing, the $V_{go}$ has slightly increased and lies at 1¾ v.

The step of the treatment carried out at 500° C. is followed by a second step of the annealing treatment in which the field effect transistor is re-heated in air at a temperature of 300° C. for 3 minutes. It has been found that not only the field effect transistor has attained a higher stability, but also that $V_{go}$ has obtained a value of substantially 0 v. (cf. the full line in FIG. 13). Field effect transistors manufactured in the same manner and subjected to the same treatment are found to have threshold gate voltages lying between 0 and 0.3 v. and ageing results in an increase of said threshold gate voltage by at the most 0.1 v.

It should be noted that the satisfactory properties of the contact according to the invention are obtained not only by the addition of indium, but that gallium may also be added beside or instead of indium. The decrease of the melting point of gold by the addition of gallium is slightly stronger, however, than in the case of addition of indium. The contact material according to the invention exhibits similar properties on cadmium sulphide and it forms, for example, ohmic contacts with n-type cadmium telluride. The contact material is also important for the formation of an ohmic contact in photocells of cadmium sulphide, cadmium selenide or mixed crystals thereof, the low contact resistance being particularly advantageous. Furthermore, the field effect transistors using cadmium sulphide or cadmium selenide and having source-and-drain electrodes according to the invention may be used as photosensitive elements.

What is claimed is:

1. A semiconductor device comprising a semiconductor body of a chalcogenide material comprising at least one sulphide, selenide or telluride of one or more of the elements zinc, cadmium and mercury and mixed crystals thereof, and a low contact resistance ohmic contact to said body, said ohmic contact consisting essentially of an alloy of (a) gold as the major constituent, and as minor constituents (b) at least one of the elements indium and gallium, and (c) at least one of the elements zinc and cadmium.

2. A semiconductor device as set forth in claim 1 wherein the body comprises a cadmium chalcogenide, and the contact includes cadmium.

3. A semiconductor device as set forth in claim 2 wherein the body comprises cadmium sulphide or cadmium selenide, the indium and gallium content of the contact is up to 10 atomic percent, and the zinc and cadmium content of the contact is up to 20 atomic percent.

4. A semiconductor device as set forth in claim 1 wherein the device is a field-effect transistor having source and drain electrodes and a gate electrode separated from the semiconductor body by an insulating layer, at least one of said source and drain electrodes being the said ohmic contact.

5. A semiconductor device as set forth in claim 4 wherein all three electrodes are on the same surface of the semiconductor body.

6. A semiconductor device as set forth in claim 4 wherein the insulating layer is aluminum oxide.

7. A semiconductor device as set forth in claim 6 wherein all three electrodes are arranged on a substrate and the semiconductor is disposed over the electrodes, and the gate electrode is aluminum.

References Cited

UNITED STATES PATENTS

| | | | |
|---|---|---|---|
| 3,041,508 | 6/1962 | Henkel et al. | 317—234 |
| 3,258,663 | 6/1966 | Weimer | 317—235 |
| 3,290,569 | 12/1966 | Weimer | 317—235 |
| 3,379,931 | 4/1968 | Soldano | 317—235 |

JAMES D. KALLAM, Primary Examiner

U.S. Cl. X.R.

317—235

PO-1050
5/69)

UNITED STATES PATENT OFFICE

CERTIFICATE OF CORRECTION

Patent No. 3518511 Dated June 30, 1970

Inventor(s) HEIN KOELMANS

It is certified that error appears in the above-identified patent and that said Letters Patent are hereby corrected as shown below:

Column 1, line 31, "calcogenides" should read --chalcogenides--.

line 59, "sulphite" should read --sulphide--.

Column 3, line 22, "toward" should read --towards--.

Column 4, line 66, after "finished" should be inserted --field--.

Column 6, line 34, "resumes" should read --reassumes--.

line 46, "at. percent and cadmium being absorbed by diffusion" should read (as the beginning of a new paragraph) --Like in Figs. 15 and 16, the successive curves in Fig.--.

Column 7, line 10, "ma" should read --mA--.

line 74, "strip" should read --strips--.

Column 8, line 64, "no" should read --now--.

SIGNED AND
SEALED
JAN 19 1971

(SEAL)
Attest:

Edward M. Fletcher, Jr.
Attesting Officer

WILLIAM E. SCHUYLER, JR.
Commissioner of Patents

Signed and sealed this day of , 1970.